United States Patent
Li et al.

(10) Patent No.: US 10,893,360 B2
(45) Date of Patent: Jan. 12, 2021

(54) POP SOUND SUPPRESSION METHOD, AUDIO OUTPUT CIRCUIT, AND TERMINAL

(71) Applicant: Huawei Technologies Co., Ltd., Shenzhen (CN)

(72) Inventors: Ding Li, Shenzhen (CN); Shuai Du, Chengdu (CN); Jun Li, Shanghai (CN); Deyang Yin, Shenzhen (CN)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 0 days.

(21) Appl. No.: 16/601,133

(22) Filed: Oct. 14, 2019

(65) Prior Publication Data
US 2020/0045417 A1 Feb. 6, 2020

Related U.S. Application Data

(63) Continuation of application No. PCT/CN2018/079586, filed on Mar. 20, 2018.

(30) Foreign Application Priority Data

Apr. 28, 2017 (CN) .......................... 2017 1 0296857

(51) Int. Cl.
*H04R 3/02* (2006.01)
*H03M 1/66* (2006.01)
(Continued)

(52) U.S. Cl.
CPC ................ *H04R 3/02* (2013.01); *H03M 1/66* (2013.01); *H04R 5/033* (2013.01); *H04R 5/04* (2013.01)

(58) Field of Classification Search
CPC ........... H04R 3/02; H04R 5/033; H04R 5/04; H03M 1/66
See application file for complete search history.

(56) References Cited

U.S. PATENT DOCUMENTS

| | | |
|---|---|---|
| 4,788,508 A | 11/1988 | Kawai |
| 2005/0195991 A1 | 9/2005 | Wang et al. |

(Continued)

FOREIGN PATENT DOCUMENTS

| | | |
|---|---|---|
| CN | 101309071 A | 11/2008 |
| CN | 101350593 A | 1/2009 |

(Continued)

OTHER PUBLICATIONS

Machine Translation and Abstract of Chinese Publication No. CN101309071, Nov. 19, 2008, 20 pages.

(Continued)

*Primary Examiner* — Andrew L Sniezek
(74) *Attorney, Agent, or Firm* — Conley Rose, P.C.

(57) ABSTRACT

A pop sound suppression method, an audio output circuit, and a terminal suppress a pop sound that is generated when an audio output circuit is in an alternating current (AC) coupling structure. The output circuit includes an output power amplifier, a common-mode voltage buffer, a reference voltage generation circuit, a powered-on pop sound suppression switch, and a common-mode switch. The powered-on pop sound suppression switch is configured to control, in a power-on process of the audio output circuit, a voltage level of an output node to be zero. The common-mode switch is configured to control, when a reference voltage level of the reference voltage generation circuit is zero, the voltage level of the output node to be equal to the reference level.

20 Claims, 2 Drawing Sheets

(51) Int. Cl.
*H04R 5/033* (2006.01)
*H04R 5/04* (2006.01)

(56) References Cited

U.S. PATENT DOCUMENTS

| | | | |
|---|---|---|---|
| 2006/0182265 A1 | 8/2006 | Sorace et al. | |
| 2006/0182266 A1 | 8/2006 | Cusinato et al. | |
| 2008/0049952 A1 | 2/2008 | Jung et al. | |
| 2011/0007912 A1 | 1/2011 | Thompson | |
| 2012/0183155 A1* | 7/2012 | Huang | H03F 1/305 381/94.5 |
| 2013/0271215 A1* | 10/2013 | Lang | H03F 1/14 330/251 |
| 2014/0086432 A1* | 3/2014 | Yang | H03G 3/348 381/94.5 |
| 2016/0065143 A1 | 3/2016 | Grand et al. | |

FOREIGN PATENT DOCUMENTS

| | | |
|---|---|---|
| CN | 103248985 A | 8/2013 |
| CN | 103402157 A | 11/2013 |
| CN | 105554634 A | 5/2016 |
| TW | 200937994 A | 9/2009 |
| WO | 2005096529 A1 | 10/2005 |

OTHER PUBLICATIONS

Machine Translation and Abstract of Chinese Publication No. CN101350593, Jan. 21, 2009, 8 pages.
Machine Translation and Abstract of Chinese Publication No. CN103248985, Aug. 14, 2013, 30 pages.
Machine Translation and Abstract of Chinese Publication No. CN103402157, Nov. 20, 2013, 18 pages.
Machine Translation and Abstract of Chinese Publication No. CN105554634, May 4, 2016, 14 pages.
Machine Translation and Abstract of Taiwanese Publication No. TW200937994, Sep. 1, 2009, 11 pages.
Wikipedia, "A-weighting", the free encyclopedia, Retrieved from the internet: https://en.wikipedia.org/wiki/A-weighting, on Feb. 27, 2020, 7 pages.
Foreign Communication From a Counterpart Application, Chinese Application No. 201710296857.6, Chinese Office Action dated May 30, 2019, 9 pages.
Foreign Communication From a Counterpart Application, PCT Application No. PCT/CN2018/079586, English Translation of International Search Report dated Jun. 15, 2018, 2 pages.
Foreign Communication From a Counterpart Application, PCT Application No. PCT/CN2018/079586, English Translation of Written Opinion dated Jun. 15, 2018, 4 pages.
Foreign Communication From a Counterpart Application, European Application No. 18790297.8, Extended European Search Report dated Feb. 3, 2020, 10 pages.

* cited by examiner

POP SOUND SUPPRESSION METHOD, AUDIO OUTPUT CIRCUIT, AND TERMINAL

CROSS-REFERENCE TO RELATED APPLICATION

This application is a continuation Application of International Patent application No. PCT/CN2018/079586 field on Mar. 20, 2018, which claims priority to Chinese Patent Application No. 201710296857.6 filed on Apr. 28, 2017. The disclosures of the aforementioned applications are hereby incorporated by reference in their entireties.

TECHNICAL FIELD

This application relates to the circuit field, and in particular, to a pop sound suppression method, an audio output circuit, and a terminal.

BACKGROUND

Human beings are extremely sensitive to a sudden signal change due to physiological particularity of human brains. Therefore, any non-ideal small change caused in a load path starting process may be sensed by human ears. Such a sound sounds like "pop" in most times and therefore is referred to as a pop sound.

Audio data is classified into alternating current (AC) coupling output and direct current (DC) coupling output based on output coupling types of the audio data. FIG. 1 is a schematic diagram of an AC coupling output structure. A single power supply is used for AC coupling output. Therefore, when an input signal amplitude is zero, an output node (namely, an OUT node) is at a non-zero level and usually at a ½ power supply level, and therefore cannot directly drive a load. To ensure that there is no direct current on the load, an AC coupling capacitor needs to be connected between the OUT node and the load in series. When the AC coupling output structure (a single power supply structure) is used, because the OUT node and the load are separated by the AC coupling capacitor, before power-on, the OUT node is a weak driving node at a level approximate to 0. In a power-on process and in a period after the power-on is completed, using an initial powered-on pop suppression circuit, the OUT node is pulled down to be at a zero level, to suppress a pop sound that may be generated during the power-on. However, during final working, the OUT node has a non-zero common-mode level (usually ½ VDD), and an actual signal of the OUT node is the non-zero common-mode level (DC level) plus an audio AC signal.

Therefore, it can be learned that, a level of the OUT node needs to gradually change from an initial zero level to a common-mode level that is a ½ power supply level, and a pop sound is very easily generated in such a change process. In view of this, this application provides a pop sound suppression solution, to suppress a pop sound generated when the AC coupling output structure is used.

SUMMARY

Embodiments of this application provide a pop sound suppression method, an audio output circuit, and a terminal, to suppress a pop sound easily generated when an audio output circuit is in an AC coupling structure.

The specific technical solutions provided in the embodiments of this application are as follows.

According to a first aspect, an embodiment of this application provides a pop sound suppression method, applied to an audio output circuit in an alternating current coupling structure, where the audio output circuit includes an output power amplifier, a common-mode level buffer, a reference level generation circuit, a powered-on pop sound suppression switch, and a common-mode switch, the reference level generation circuit is coupled to the common-mode level buffer, the powered-on pop sound suppression switch is coupled to an output node of the output power amplifier and a local ground, and the common-mode switch is coupled to the output node and the common-mode level buffer, and the method includes in a power-on process of the audio output circuit, closing the powered-on pop sound suppression switch at a first moment to enable a level of the output node to be zero, and when a reference level of the reference level generation circuit is zero, controlling the common-mode switch at a second moment using the common-mode level buffer, to enable the level of the output node to be equal to the reference level, where the second moment is later than the first moment.

In this design, in the power-on process of the audio output circuit, using a noise control switch, the output node is forcibly pulled down to be at a zero level, to ensure that there is no pop sound. Then, when the reference level is zero, the common-mode switch is controlled using the common-mode level buffer, to pull down the level of the output node to be a level that is the same as the reference level in this case, namely, a zero level. Therefore, no pop sound is generated.

With reference to the first aspect, in a possible design, after the common-mode switch is controlled, when the reference level of the reference level generation circuit is zero, at the second moment to enable the level of the output node to be zero, the method further includes opening the powered-on pop sound suppression switch at a third moment, where the third moment is later than the second moment, controlling the reference level of the reference level generation circuit to rise from zero to a common-mode level, to enable the level of the output node to rise from zero to the common-mode level within preset duration, and starting the output power amplifier, and driving, using the reference level generation circuit, the output node to be at the common-mode level within the preset duration.

In this design, from power-on to normal working, the reference level rises very slowly due to the reference level generation circuit. Therefore, the common-mode level rises slowly, and the level of the output node rises slowly from the zero level to the common-mode level, generating only an infrasound wave without generating a pop sound. Then, the output power amplifier is started. If an offset of the output power amplifier is not considered, the output node is driven by the output power amplifier to be at the common-mode level. Compared with the previous operation of pulling, using the common-mode switch, the output node to be at the common-mode level, this operation does not change the level, and therefore no pop sound is generated.

With reference to the first aspect, in a possible design, the common-mode level is a half of a rated working level of the output power amplifier.

According to a second aspect, an embodiment of this application provides an audio output circuit in an alternating current coupling structure, including an output power amplifier, a common-mode level buffer, a reference level generation circuit, a powered-on pop sound suppression switch, and a common-mode switch, where the reference level generation circuit is coupled to the common-mode level buffer, the powered-on pop sound suppression switch is coupled to an output node of the output power amplifier and a local ground, and the common-mode switch is coupled to the output node and the common-mode level buffer, the powered-on pop sound suppression switch is configured to, in a power-on process of the audio output circuit, control a level of the output node to be zero, and the common-mode switch is configured to, when a reference level of the reference level generation circuit is zero, control the level of the output node to be equal to the reference level.

With reference to the second aspect, in a possible design, the audio output circuit further includes a noise suppression module configured to enable, in the power-on process of the audio output circuit, the level of the output node to be zero.

With reference to the second aspect, in a possible design, the audio output circuit further includes a reference level generation module configured to control the reference level of the reference level generation circuit to rise from zero to a common-mode level, to enable the level of the output node to rise from zero to the common-mode level within preset duration.

Optionally, the audio output circuit further includes a first control circuit and a second control circuit, where the first control circuit is configured to close, in the power-on process of the audio output circuit, the powered-on pop sound suppression switch at a first moment to enable the level of the output node to be zero, and the second control circuit is configured to control the common-mode switch at a second moment using the common-mode level buffer to enable the level of the output node to be equal to the reference level when the reference level of the reference level generation circuit is zero, where the second moment is later than the first moment.

Optionally, the audio output circuit further includes a third control circuit configured to open the powered-on pop sound suppression switch at a third moment after the common-mode switch is controlled, when the reference level of the reference level generation circuit is zero, at the second moment to enable the level of the output node to be zero, where the third moment is later than the second moment, control the reference level of the reference level generation circuit to rise from zero to a common-mode level, to enable the level of the output node to rise from zero to the common-mode level within preset duration, and start the output power amplifier, and drive, using the reference level generation circuit, the output node to be at the common-mode level within the preset duration.

With reference to the second aspect, in a possible design, the common-mode level is a half of a rated working level of the output power amplifier.

According to a third aspect, an embodiment of this application provides a terminal, including an application processor, a digital-to-analog converter, the audio output circuit according to the second aspect, and a headset, where the application processor is configured to obtain a digital audio bitstream, and output the digital audio bitstream to the digital-to-analog converter, the digital-to-analog converter is configured to convert the digital audio bitstream into an analog audio signal, and output the analog audio signal to the audio output circuit, and the audio output circuit is configured to convert the analog audio signal into a driving analog audio signal having a driving capability, and output the driving analog audio signal to the headset.

DESCRIPTION OF EMBODIMENTS

The following clearly describes the technical solutions in the embodiments of this application with reference to the accompanying drawings in the embodiments of this application.

Figure 1:
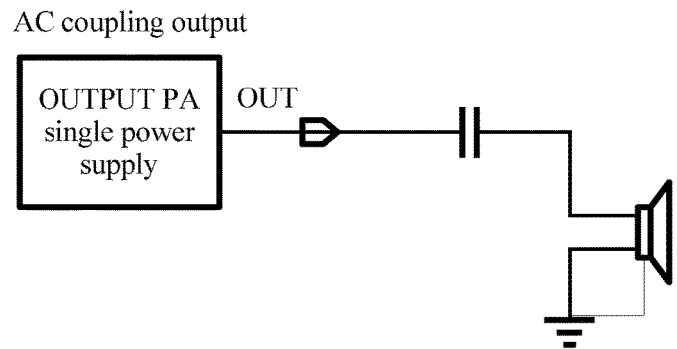
FIG. 1 is a schematic diagram of an AC coupling output structure.

It can be learned from FIG. 1 that, when an audio output circuit is in an AC coupling structure, because an OUT node and a load are separated by an AC coupling capacitor, before power-on, the OUT node is a weak driving node at a level approximate to 0. However, during final working, the OUT node has a non-zero common-mode level, and an actual signal of the OUT node is the non-zero common-mode level plus an audio AC signal.

Therefore, it can be learned that, a level of the OUT node needs to gradually change from an initial zero level to a common-mode level, and a pop sound is very easily generated in such a change process.

In view of the foregoing problem, the embodiments of this application provide a pop sound suppression method, an audio output circuit, and a terminal, to suppress a pop sound easily generated when an audio output circuit is in an AC coupling structure. The method and the apparatuses are based on a same disclosure concept. Because problem resolving principles of the method and the apparatuses are similar, mutual references may be made to implementation of the apparatuses and the method, and no repeated description is provided. In the embodiments of this application, in a power-on process of the audio output circuit, a reference level (VREF) generation circuit pin and an external capacitor in an existing audio circuit are used, no other pin and peripheral circuit are added, only one common-mode switch is added to an internal circuit, the original audio circuit is not modified, and no more constraints are imposed on the original audio circuit. Therefore, final costs are not increased.

Figure 2:
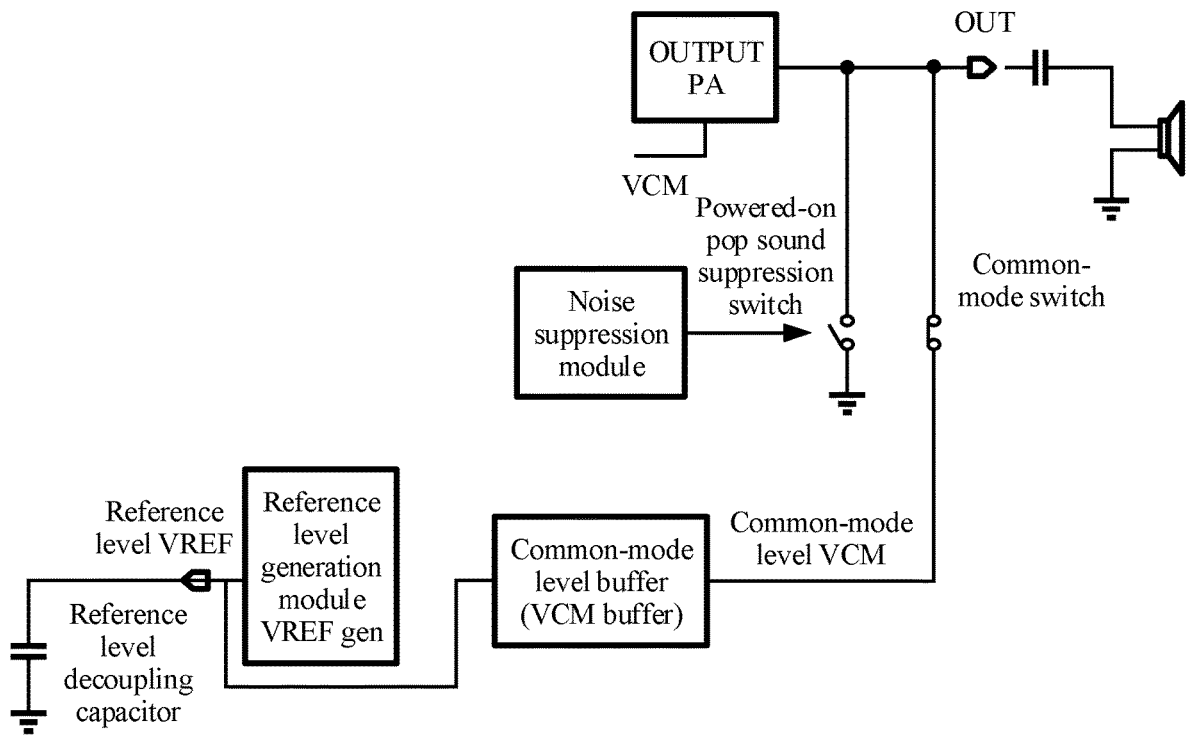
FIG. 2 is a structural diagram of an audio output circuit in an alternating current coupling structure according to an embodiment of this application.

FIG. 2 is a structural diagram of an audio output circuit in an alternating current coupling structure according to an embodiment of this application. The audio output circuit includes an output power amplifier (designated as OUTPUT PA), a common-mode level buffer (vcm buffer), a reference level generation circuit including a reference level generation module and a reference level decoupling capacitor, a noise suppression module, the reference level generation module, a powered-on pop sound suppression switch, and a common-mode switch. The reference level generation circuit is coupled to the common-mode level buffer, the powered-on pop sound suppression switch is coupled to an output node of the output power amplifier and a local ground, and the common-mode switch is coupled to the output node and the common-mode level buffer. The powered-on pop sound suppression switch and the common-mode switch are components newly added to an existing audio output circuit that is used.

The powered-on pop sound suppression switch is configured to, in a power-on process of the audio output circuit, control a level of the output node to be zero.

The common-mode switch is configured to, when a reference level of the reference level generation circuit is zero, control the level of the output node to be equal to the reference level.

Optionally, the noise suppression module is configured to enable the level of the output node to be zero in the power-on process of the audio output circuit.

Optionally, the reference level generation module is configured to control the reference level of the reference level generation circuit to rise from zero to a common-mode level, to enable the level of the output node to rise from zero to the common-mode level within preset duration.

Optionally, the audio output circuit further includes a first control circuit and a second control circuit.

The first control circuit is configured to, in the power-on process of the audio output circuit, close the powered-on pop sound suppression switch at a first moment to enable the level of the output node to be zero.

The second control circuit is configured to control the common-mode switch at a second moment using the common-mode level buffer when the reference level of the reference level generation circuit is zero, to enable the level of the output node to be equal to the reference level, where the second moment is later than the first moment.

Optionally, the audio output circuit further includes a third control circuit configured to open the powered-on pop sound suppression switch at a third moment after the common-mode switch is controlled, when the reference level of the reference level generation circuit is zero, at the second moment to enable the level of the output node to be zero, where the third moment is later than the second moment, control the reference level of the reference level generation circuit to rise from zero to a common-mode level, to enable the level of the output node to rise from zero to the common-mode level within preset duration, and start the output power amplifier, and drive, using the reference level generation circuit, the output node to be at the common-mode level within the preset duration.

The common-mode level is a half of a rated working level of the output power amplifier.

In the audio output circuit, in the power-on process, using the powered-on pop sound suppression switch, the output node is initially pulled down to be at a zero level, and then when the reference level generation module is not powered on and the reference level of the reference level generation circuit is zero, using the common-mode switch, the output node is pulled down to be at a level that is the same as the reference level of the reference level generation circuit, namely, a zero level. Therefore, no pop sound is generated in the audio output circuit before power-on. In the power-on process, the reference level generation module starts to be powered on. The reference level rises very slowly due to the reference level generation circuit. Therefore, the common-mode level rises slowly, and the level of the output node rises slowly from the zero level to the common-mode level, generating only an infrasound wave without generating a pop sound. Then, the OUTPUT PA is started. If an offset of the OUTPUT PA is not considered, the output node is driven by the OUTPUT PA to be at the common-mode level. Compared with the previous operation of pulling, using the VCM switch, the output node to be at the common-mode level, this solution does not change the level, and therefore no pop sound is generated.

It should be noted that, for the operation of pulling, using the common-mode switch, the output node down to be at the common-mode level and the operation of driving, using the OUTPUT PA, the output node to be at the common-mode level, the level of the output node does not change. Therefore, even if the OUTPUT PA is enabled before the reference level is completely established, the output node does not jump, and therefore no pop sound is generated. Only such a design that the common-mode level buffer can still normally work when the reference level is equal to 0 is required. In addition, the OUTPUT PA of the audio output circuit does not need to be modified, the reference level generation circuit is used, the capacitor is required in the existing audio circuit for noise reduction, and no other pin and peripheral element are added, thereby reducing circuit costs.

Figure 3:
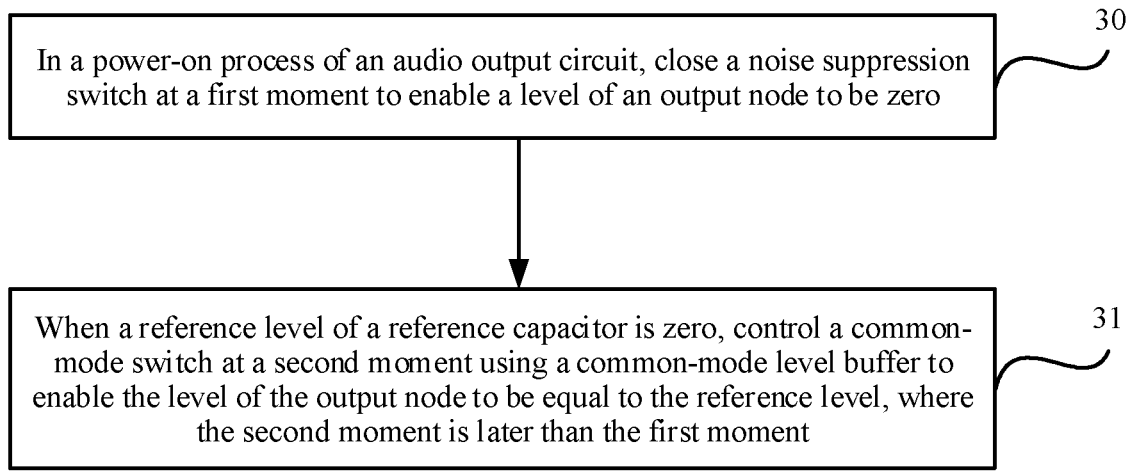
FIG. 3 is a flowchart of a pop sound suppression method according to an embodiment of this application.

Based on the audio output circuit shown in FIG. 2, referring to FIG. 3, an embodiment of this application provides a pop sound suppression method. A specific procedure is as follows.

Step 30: In a power-on process of the audio output circuit, close the powered-on pop sound suppression switch at a first moment to enable a level of the output node to be zero.

Step 31: When a reference level of the reference level generation circuit is zero, control the common-mode switch at a second moment using the common-mode level buffer to enable the level of the output node to be equal to the reference level, where the second moment is later than the first moment.

Optionally, after the common-mode switch is controlled, when the reference level of the reference level generation circuit is zero, at the second moment to enable the level of the output node to be zero, the method further includes opening the powered-on pop sound suppression switch at a third moment, where the third moment is later than the second moment, controlling the reference level of the reference level generation circuit to rise from zero to a common-mode level to enable the level of the output node to rise from zero to the common-mode level within preset duration, and starting the output power amplifier, and driving, using the reference level generation circuit, the output node to be at the common-mode level within the preset duration.

Optionally, the common-mode level is a half of a rated working level of the output power amplifier.

Figure 4:
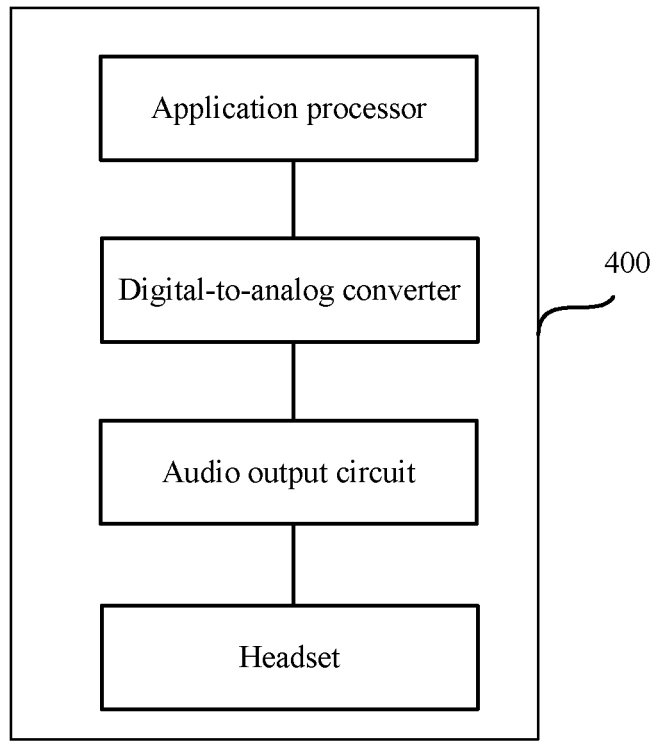
FIG. 4 is a structural diagram of a pop sound suppression terminal according to an embodiment of this application.

Referring to FIG. 4, an embodiment of this application provides a pop sound suppression terminal 400. The terminal 400 includes an application processor (also referred to as AP), a digital-to-analog converter (also referred to as DAC), an audio output circuit, and a headset. For a structure of the audio output circuit, refer to FIG. 2.

The application processor is configured to obtain a digital audio bitstream, and output the digital audio bitstream to the digital-to-analog converter.

The digital-to-analog converter is configured to convert the digital audio bitstream into an analog audio signal, and output the analog audio signal to the audio output circuit.

The audio output circuit is configured to convert the analog audio signal into a driving analog audio signal having a driving capability, and output the driving analog audio signal to the headset.

In conclusion, according to the noise suppression solution provided in the embodiments of this application, pop sounds can be greatly reduced in a common-mode establishment process of the audio output circuit in a single power supply and AC coupling mode, thereby improving user experience.

All or some of the foregoing embodiments may be implemented using software, hardware, or any combination thereof. When the software is used to implement the embodiments, all or some of the embodiments may be implemented in a form of a computer program product.

The computer program product includes one or more computer instructions. When the computer program instructions are loaded and executed on a computer, all or some of the procedures or functions according to the embodiments of the present disclosure are generated. The computer may be a general-purpose computer, a special-purpose computer, a computer network, or another programmable apparatus. The computer instructions may be stored in a computer readable storage medium, or may be transmitted from a computer readable storage medium to another computer readable storage medium. For example, the computer instructions may be transmitted from a website, computer, server, or data center to another website, computer, server, or data center in a wired (for example, a coaxial cable, a twisted pair, or an optical fiber) or wireless (for example, infrared, radio, or microwave) manner. The computer readable storage medium may be any usable medium accessible to the computer, or a data storage device, such as a server or a data center, integrating one or more usable media. The usable medium may be a magnetic medium (for example, a FLOPPY DISK, a hard disk, or a magnetic tape), an optical medium (for example, an optical disc), a semiconductor medium (for example, a solid-state drive), or the like.

A person skilled in the art can make various modifications and variations to this application without departing from the scope of this application. In this way, this application is intended to cover these modifications and variations provided that they fall within the scope of the claims of this application.

What is claimed is:

1. A pop sound suppression method applied to an audio output circuit, comprising:
    closing, a powered-on pop sound suppression switch at a first moment, wherein the audio output circuit comprises an output power amplifier, a common-mode voltage buffer, a reference voltage generation circuit, the powered-on pop sound suppression switch that is coupled to and output node of the output power amplifier; and a ground, and a common-mode switch, wherein an output end of the reference voltage generation circuit is coupled to an input end of the common-mode voltage buffer, and wherein a first end of the common-mode switch is coupled to the output node, and a second end of the common-mode switch is coupled to the common-mode voltage buffer;
    closing the common-mode switch at a second moment when the reference voltage generation circuit generates a reference voltage level that is zero, wherein the second moment is later than the first moment; and
    controlling the voltage level of the output node to be equal to the reference voltage level using the common-mode voltage buffer at the second moment when the reference voltage level using the reference voltage generation circuit is zero.

2. The pop sound suppression method of claim 1, wherein after controlling the voltage level of the output node to be equal to the reference voltage level, the pop sound suppression method further comprises:
    opening, the powered-on pop sound suppression switch at a third moment, wherein the third moment is later than the second moment;
    controlling, the reference voltage level of the reference voltage generation circuit to rise from zero to a common-mode voltage level to enable the voltage level of the output node to rise from zero to the common-mode voltage level within a preset duration; and
    starting the output power amplifier after the voltage level of the output node rises to the common-mode voltage level.

3. The pop sound suppression method of claim 2, wherein the common-mode voltage level is a half of a rated working voltage level of the output power amplifier.

4. An audio output circuit, comprising:
    an output power amplifier;
    a common-mode voltage buffer;
    a reference voltage generation circuit comprising: an output end coupled to an input end of the common-mode voltage buffer;
    a powered-on pop sound suppression switch coupled to an output node of the output power amplifier and a ground; and
    a common-mode switch comprising:
       a first end coupled to the output node; and
       a second end coupled to the common-mode voltage buffer; and
    a control circuit, configured to:
       close the powered-on pop sound suppression switch at a first moment;
       close the common-mode switch at a second moment when the reference voltage generation circuit generates a reference voltage level that is zero, wherein the second moment is later than the first moment; and
       control the voltage level of the output node to be equal to the reference voltage level using the common-mode voltage buffer at the second moment when the reference voltage level of the reference voltage generation circuit is zero.

5. The audio output circuit of claim 4, further comprising a noise suppression circuit coupled to the powered-on pop sound suppression switch and configured to enable the voltage level of the output node to be zero in a power-on process of the audio output circuit.

6. The audio output circuit of claim 4, wherein the reference voltage generation circuit comprises:
    a reference voltage generator; and
    a reference level decoupling capacitor, wherein the reference voltage generator is coupled to a first end of the reference level decoupling capacitor, wherein a second end of the reference level decoupling capacitor is coupled to the ground, and wherein the reference voltage generator is configured to generate the reference voltage level rising from zero to the common-mode voltage level at a third moment.

7. The audio output circuit of claim 4, wherein the control circuit is further configured to:
    open the powered-on pop sound suppression switch at a third moment, wherein the third moment is later than the second moment;
    control, the reference voltage level of the reference voltage generation circuit to rise from zero to a common-mode voltage level to enable the voltage level of the output node to rise from zero to the common-mode voltage level within a preset duration; and
    start the output power amplifier after the voltage level of the output node rises to the common-mode voltage level.

8. The audio output circuit of claim 7, wherein the common-mode voltage level is a half of a rated working voltage level of the output power amplifier.

9. The audio output circuit of claim 4, wherein the reference voltage generation circuit further comprises a reference level decoupling capacitor.

10. The audio output circuit of claim 4, further comprising a noise suppression circuit coupled to the powered-on pop sound suppression switch.

11. The audio output circuit of claim 4, wherein the reference voltage generation circuit is configured to generate the reference voltage level rising from zero to the common-mode voltage level at a third moment.

12. A terminal, comprising:
an application processor; and
an audio output circuit coupled to the application processor, wherein the audio output circuit comprises:
a output power amplifier;
a common-mode voltage buffer;
a reference voltage generation circuit comprising an output end coupled to an input end of the common-mode voltage buffer;
a powered-on pop sound suppression switch coupled to an output node of the output power amplifier and a ground; and
a common-mode switch, comprising:
a first end coupled to the output node; and
a second end coupled to the common-mode voltage buffer; and
a control circuit, configured to:
close the powered-on pop sound suppression switch at a first moment;
close the common-mode switch at a second moment when the reference voltage generation circuit generates a reference voltage level that is zero, wherein the second moment is later than the first moment; and
control the voltage level of the output node to be equal to the reference voltage level using the common-mode voltage buffer at the second moment when the reference voltage level of the reference voltage generation circuit is zero.

13. The terminal of claim 12, wherein the control circuit is further configured to:
open the powered-on pop sound suppression switch at a third moment, wherein the third moment is later than the second moment;
control the reference voltage level of the reference voltage generation circuit to rise from zero to a common-mode voltage level to enable the voltage level of the output node to rise from zero to the common-mode voltage level within a preset duration; and
start the output power amplifier after the voltage level of the output node rises to the common-mode voltage level.

14. The terminal of claim 12, wherein the audio output circuit further comprises a noise suppression circuit coupled to the powered-on pop sound suppression switch and configured to enable the voltage level of the output node to be zero in a power-on process of the audio output circuit.

15. The terminal of claim 12, wherein the reference voltage generation circuit comprises:
a reference voltage generator; and
a reference level decoupling capacitor, wherein the reference voltage generator is coupled to a first end of the reference level decoupling capacitor, wherein a second end of the reference level decoupling capacitor is coupled to the ground, and wherein the reference voltage generator is configured to generate the reference voltage level rising from zero to the common-mode voltage level at the third moment.

16. The terminal of claim 12, wherein the common-mode voltage level is a half of a rated working voltage level of the output power amplifier.

17. The terminal of claim 12, wherein the application processor is configured to:
obtain a digital audio bitstream; and
output the digital audio bitstream into a digital-to-analog converter.

18. The terminal of claim 17, wherein the digital-to-analog converter is configured to:
convert the digital audio bitstream into an analog audio signal; and
output the analog audio signal to an audio output circuit.

19. The terminal of claim 18, wherein the audio output circuit is configured to:
convert the analog audio signal into a driving analog audio signal having a driving capability; and
output the driving analog audio signal to a headset.

20. The terminal of claim 12, wherein the reference voltage generation circuit further comprises a reference level decoupling capacitor.

* * * * *

UNITED STATES PATENT AND TRADEMARK OFFICE
CERTIFICATE OF CORRECTION

PATENT NO. : 10,893,360 B2  
APPLICATION NO. : 16/601133  
DATED : January 12, 2021  
INVENTOR(S) : Ding Li et al.

Page 1 of 1

It is certified that error appears in the above-identified patent and that said Letters Patent is hereby corrected as shown below:

In the Claims

Claim 1, Column 7, Line 51: "voltage level using the reference" should read "voltage level of the reference"

Signed and Sealed this  
Second Day of March, 2021

Drew Hirshfeld  
*Performing the Functions and Duties of the*  
*Under Secretary of Commerce for Intellectual Property and*  
*Director of the United States Patent and Trademark Office*